United States Patent
Knauer (10) Patent No.: US 9,591,788 B2
(45) Date of Patent: Mar. 7, 2017

(54) COUPLING SYSTEM BETWEEN A WASTE-HEAT GENERATOR AND A WASTE-HEAT RECEIVER

(75) Inventor: Hans Knauer, Leutenbach (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 738 days.

(21) Appl. No.: 13/446,597

(22) Filed: Apr. 13, 2012

(65) Prior Publication Data

US 2012/0261108 A1    Oct. 18, 2012

(30) Foreign Application Priority Data

Apr. 13, 2011   (EP) ..................................... 11162231

(51) Int. Cl.
*H05K 7/20*   (2006.01)
(52) U.S. Cl.
CPC ......... *H05K 7/20418* (2013.01); *H05K 7/209* (2013.01)
(58) Field of Classification Search
CPC ......... H05K 7/2089; H05K 7/209; H05K 7/20
USPC ......... 165/64, 80.1, 185; 361/704, 709, 710, 361/711; 403/11, 13, 381
See application file for complete search history.

(56) References Cited

U.S. PATENT DOCUMENTS

| | | | | |
|---|---|---|---|---|
| 4,509,839 A | * | 4/1985 | Lavochkin | H01L 23/4093 165/80.1 |
| 4,707,726 A | * | 11/1987 | Tinder | H01L 23/4006 165/80.1 |
| 4,772,999 A | | 9/1988 | Herve | |
| 5,224,016 A | * | 6/1993 | Weisman et al. | 361/728 |
| 5,548,482 A | * | 8/1996 | Hatauchi et al. | 361/720 |
| 5,680,169 A | * | 10/1997 | Bae | B41J 2/315 347/197 |
| 5,842,512 A | * | 12/1998 | Guerrero | H01L 23/4093 165/185 |
| 6,431,259 B2 | | 8/2002 | Hellbruck et al. | |
| 6,771,504 B2 | * | 8/2004 | Barcley | 361/704 |
| 6,886,799 B2 | * | 5/2005 | Yamanashi | B60H 1/00535 248/300 |
| 7,119,433 B2 | * | 10/2006 | Corbin, Jr. | H01L 23/367 257/704 |
| 7,242,583 B2 | * | 7/2007 | Amber et al. | 361/707 |
| 7,455,472 B2 | * | 11/2008 | Lehner | H05K 5/0021 24/458 |
| 7,639,500 B2 | * | 12/2009 | Lang et al. | 361/702 |

(Continued)

FOREIGN PATENT DOCUMENTS

CN    101742848 A    6/2010
DE    24 18 132 A    11/1975

(Continued)

*Primary Examiner* — Len Tran
*Assistant Examiner* — Gustavo Hincapie Serna
(74) *Attorney, Agent, or Firm* — Henry M. Feiereisen LLC (57) ABSTRACT

A coupling system as a thermal interface between a waste-heat generator and a waste-heat receiver includes a first body having a first contact area, and a second body having a second contact area, with the first and second contact areas abutting one another for heat exchange. A tongue and groove connection having at least one tongue and at least one groove extends in a longitudinal direction for connecting and tensioning the first and second contact areas.

15 Claims, 6 Drawing Sheets

(56) References Cited

U.S. PATENT DOCUMENTS

| | | | |
|---|---|---|---|
| 2002/0043359 A1* | 4/2002 | Mizutani | H01L 21/4882 165/80.3 |
| 2003/0175075 A1* | 9/2003 | Garrison | 403/381 |
| 2007/0125517 A1* | 6/2007 | Schaper | 165/80.2 |
| 2008/0232065 A1 | 9/2008 | Lang | |
| 2008/0302509 A1* | 12/2008 | Chen | H01L 23/367 165/80.3 |
| 2010/0127515 A1 | 5/2010 | Wu | |
| 2010/0314073 A1* | 12/2010 | Zhao | H01L 23/4093 165/80.3 |
| 2011/0079370 A1* | 4/2011 | Wen et al. | 165/80.3 |
| 2012/0063084 A1* | 3/2012 | Fowler | H05K 7/1418 361/690 |

FOREIGN PATENT DOCUMENTS

| | | |
|---|---|---|
| DE | 85 26 283 U1 | 10/1985 |
| DE | 4406564 A1 | 9/1995 |
| DE | 102008012911 A1 | 9/2009 |
| EP | 1128432 A2 | 8/2001 |
| EP | 1 741 325 B | 4/2005 |
| EP | 2334161 A2 | 6/2011 |
| JP | H07302867 A | 11/1995 |
| JP | 2002 009466 A2 | 1/2002 |
| WO | WO 2005101939 A1 | 10/2005 |

* cited by examiner

FIG 11

COUPLING SYSTEM BETWEEN A WASTE-HEAT GENERATOR AND A WASTE-HEAT RECEIVER

CROSS-REFERENCES TO RELATED APPLICATIONS

This application claims the priority of European Patent Application, Serial No. 11162231, filed Apr. 13, 2011, pursuant to 35 U.S.C. 119(a)-(d), the content of which is incorporated herein by reference in its entirety as if fully set forth herein.

BACKGROUND OF THE INVENTION

The present invention relates to a coupling system serving as a thermal interface between a waste-heat generator, in particular a converter, and a waste-heat receiver, in particular a heat sink.

The following discussion of related art is provided to assist the reader in understanding the advantages of the invention, and is not to be construed as an admission that this related art is prior art to this invention.

A technical device's, for example an electronic component's, power dissipation that is specific to the device and dependent on its operating state in many cases causes an accumulation of heat in the device on the one hand and in its immediate surroundings on the other hand that impacts negatively on the device's functional reliability and/or life expectancy. It is therefore frequently necessary to carry off the waste or lost heat produced and duct it away from the device. The device acting as a waste-heat generator is for that purpose connected or coupled to a waste-heat receiver, typically a heat sink, for the purpose of heat exchanging. A relevant connection or, as the case may be, relevant coupling system accordingly functions primarily as a thermal interface and secondarily as a mechanical fixing means.

It would be desirable and advantageous to provide an improved coupling system which obviates prior art shortcomings and which is simple in structure and yet efficient and reliable in operation.

SUMMARY OF THE INVENTION

According to one aspect of the present invention, a coupling system as a thermal interface between a waste-heat generator, e.g. a converter, and a waste-heat receiver, e.g. a heat sink, includes a first body having a first contact area, a second body having a second contact area, with the first and second contact areas abutting one another for heat exchange, and a tongue and groove connection having at least one tongue and at least one groove extending in a longitudinal direction for connecting and tensioning the first and second contact areas.

The present invention resolves prior art shortcomings by providing a tongue and groove connection to tense the first and second bodies against each other for achieving good area contacting. Advantageously, the groove and the tongue can be configured to exert a clamping force in a direction of a surface normal of the first and second contact areas, when the groove and the tongue are fitted together.

A tongue and groove connection according to the present invention provides a practical and easy-to-realize mechanical securement. The necessary mounting space for the tongue and groove connection can be accommodated to the structural design of the waste-heat generator and/or waste-heat receiver by designing the tongue and groove appropriately and is essentially limited to the region around the contact areas themselves. In contrast to a screw joint, for instance, no directly engaging tool will be required for embodying the connection, as a result of which no corresponding space will have to be provided for a tool's engagement. Nor is it necessary to provide the operator with direct access to the fixing elements, meaning the groove and tongue, in the final mounting condition so that they can be situated freely between the waste-heat generator and waste-heat receiver in the region of the contact areas so as to favor as efficient as possible heat exchanging. Since the tensioning or pressing of the two contact areas is strongest in the region of the tongue and groove connection and heat exchanging is consequently performed particularly efficiently in that region, the tongue and groove connection is situated preferably in a region in which the production of waste heat is particularly intense so that the waste heat specifically in that region will also be ducted away more intensely. A connection of such kind will consequently provide both a practical and easy-to-realize mechanical fixing means and an efficient thermal interface.

According to another advantageous feature of the present invention, the tongue can be configured as a sliding block. Suitable sliding blocks can easily be produced in large quantities as separate components and also combined with different waste-heat generators or, as the case may be, waste-heat receivers on the building-block principle. The sliding block is therein fixed into position preferably with the aid of a releasable connection and in particular with the aid of a screw joint. The sliding block is thereby easy to replace if damaged.

According to another advantageous feature of the present invention, a plurality of sliding blocks can be arranged substantially evenly distributed on the first contact area. Advantageously, the sliding blocks are arranged in the form of a matrix. Because, with the aid of each sliding block in its interaction with the groove, a clamping force is embodied in the region of the sliding block, the even distribution of the sliding blocks on the first contact area results in an analogously even clamping-force distribution. Heat exchanging between the contact areas and the ensuing desired removal of waste heat is significantly improved thereby.

According to another advantageous feature of the present invention, a plurality of substantially parallel grooves can be provided on the second contact area. The parallel arrangement of a plurality of grooves therein in particular constitutes expedient matching to a matrix-like arrangement of a plurality of sliding blocks, with each groove being provided preferably as a counterpart for a plurality of sliding blocks. That specific combination of a matrix-like arrangement for the sliding blocks and a parallel arrangement for a plurality of grooves is suitable also for, for example, coupling a plurality of waste-heat generators to one waste-heat receiver or one waste-heat generator to a plurality of waste-heat receivers. As a result a modular structure is realized that can also be extended to a greater number of waste-heat generators and/or waste-heat receivers.

According to another advantageous feature of the present invention, each groove can have at least one insertion opening for sliding blocks and sized wider than the standard groove width. An insertion opening of such kind will make it easier to insert a sliding block into a groove and hence be supportive during mounting.

According to another advantageous feature of the present invention, the sliding block can have a T-shaped cross-section and the groove has a groove cross-section matched thereto. T-type tongue and groove connections are already employed in various applications, which in terms of the effort and costs associated with production is also advantageous in the case of the present specific application. For example it will make it possible to choose from an existing range for the sliding blocks.

According to another advantageous feature of the present invention, a spring element can be provided on an element of the tongue and groove connection and have a restoring force acting substantially in a direction of the surface normal of the first and second contact areas in a final mounting state. The presence of the restoring force produced by the spring element further increases the clamping pressure exerted by the two contact areas on each other and accordingly to further improve the heat-exchanging efficiency.

According to another advantageous feature of the present invention, the sliding block can have a crossbar, and the spring element can be located on an underside of the crossbar. This configuration is suitable particularly for easy-to-produce pressure-spring elements because as a result of the location the spring restoring force is effective parallel to the surface normal of the two contact areas.

According to another advantageous feature of the present invention, the spring element can be a leaf spring. Relevant leaf springs are on the one hand easy to produce and, on the other hand, extremely loadable.

According to another advantageous feature of the present invention, the leaf spring can be shaped like a W. The ratio between the strength of the restoring force in the deformed condition and the leaf spring's extension in the direction of the restoring force in the non-deformed condition is particularly favorable in the case of a W shape of such kind.

According to another advantageous feature of the present invention, the spring element can be held captive in place by a form-fit and preferably releasable connection. The level of mounting effort associated therewith will on the one hand be kept low thereby and, on the other hand, easy replacement will be ensured.

To ensure as efficient as possible heat exchanging a relatively large clamping pressure is provided between the two contact areas, which will make it difficult to insert the tongue into the groove during mounting. A mounting aid that exerts a mounting force acting in the longitudinal direction of the groove for realizing the tongue and groove connection may therefore be provided for the coupling system. Currently preferred is a solution with which a reduction in the force exerted is achieved through a force/travel redistribution.

According to another advantageous feature of the present invention, the mounting aid can have a threaded bolt and a counter thread for receiving the threaded bolt such that twisting the threaded bolt in the counter thread causes the first and second contact areas to move against each other transversely to a surface normal and in the longitudinal direction of the groove. A tool-engagement member, for example an engagement for a screwdriver, is suitably provided for the threaded bolt so as to realize a simple and intuitive handling for the operator.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Throughout all the figures, same or corresponding elements may generally be indicated by same reference numerals. These depicted embodiments are to be understood as illustrative of the invention and not as limiting in any way. It should also be understood that the figures are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Figure 1:
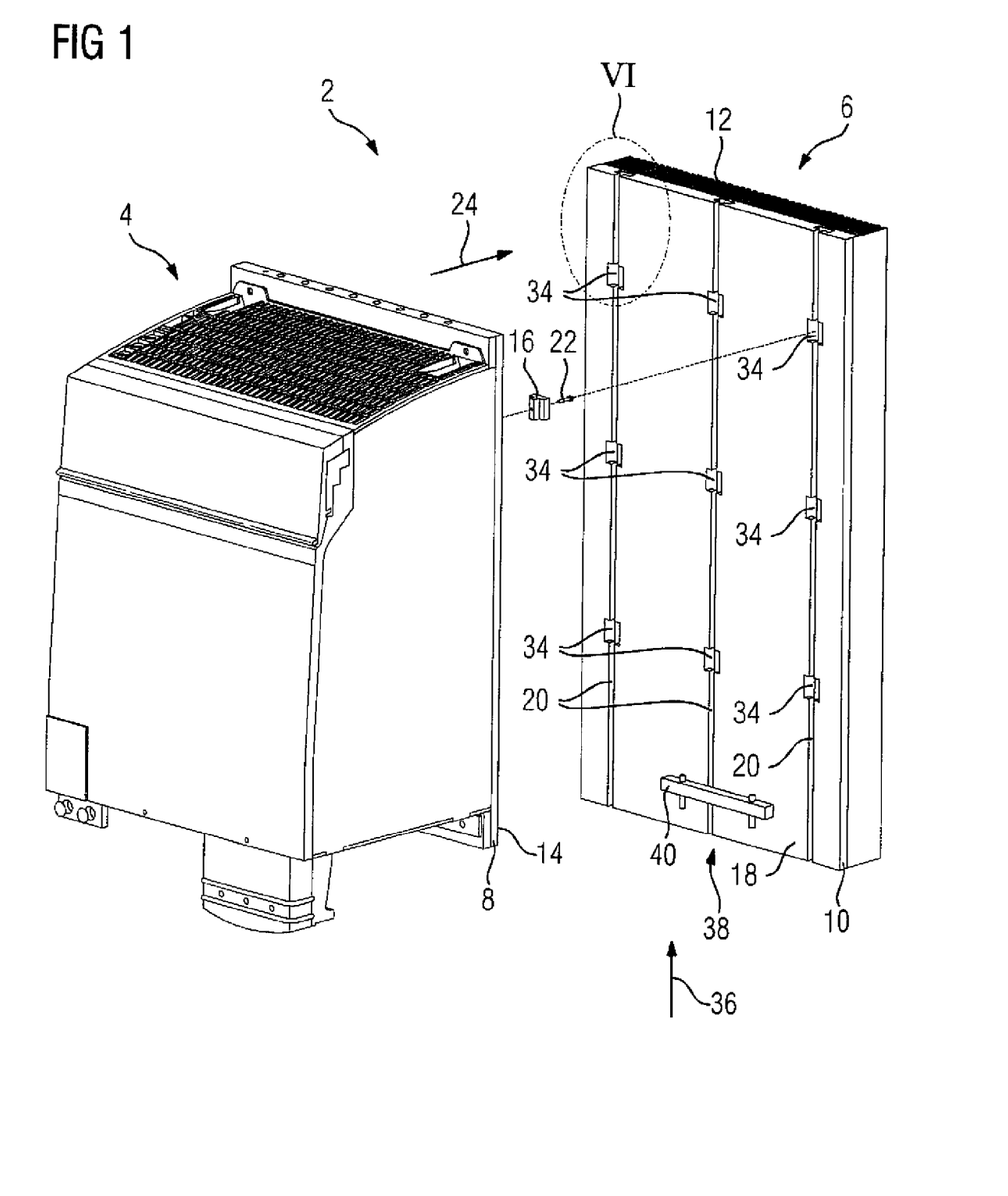
FIG. 1 is an exploded view of a coupling system as thermal interface between a converter as a waste-heat generator and a heat sink as a waste-heat receiver.
Figure 2:
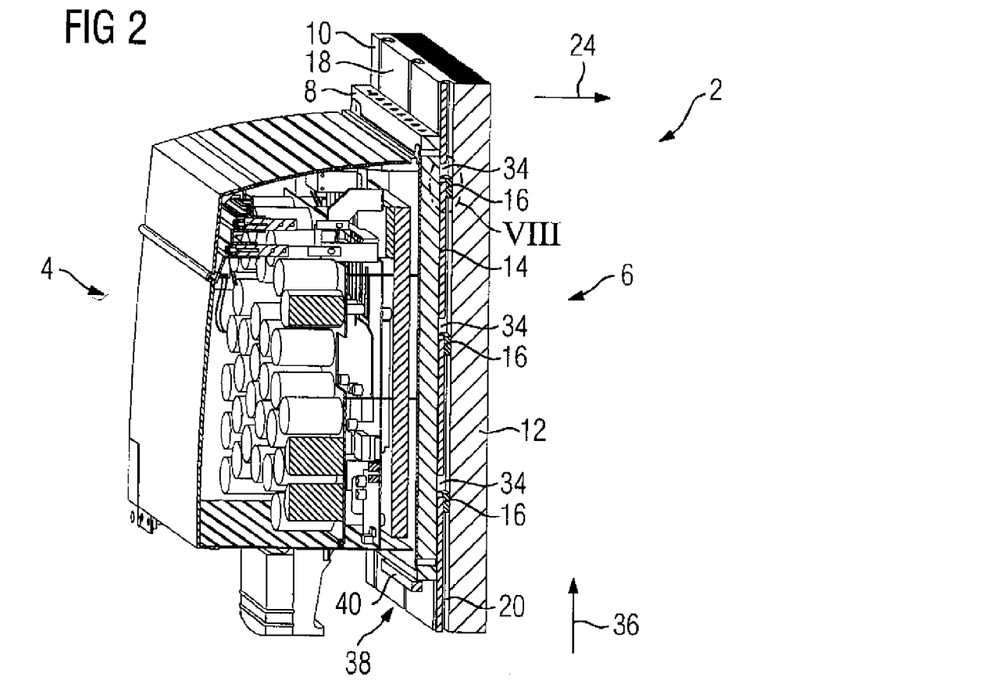
FIG. 2 is a perspective sectional view of the converter and heat sink in their final mounting condition.
Figure 3:
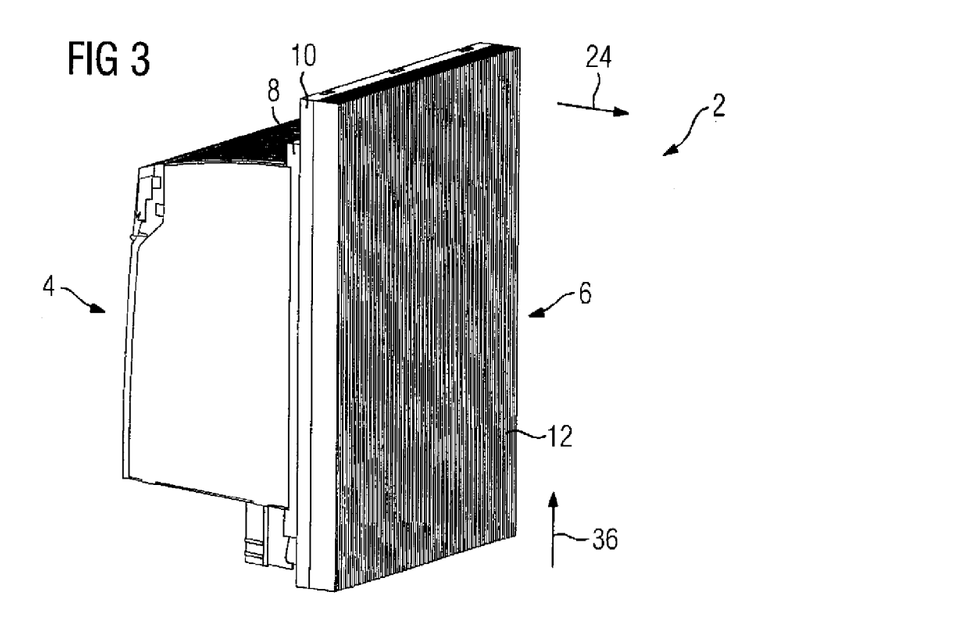
FIG. 3 is a perspective view of the converter and heat sink in their final mounting condition.

Turning now to the drawing, and in particular to FIG. 1, there is shown by way of example an exploded view of a coupling system, generally designated by reference numeral 2 as thermal interface between a converter 4 and a heat sink 6. The converter 4 acts therein as a waste-heat generator and has a cuboidal first contact plate 8 made of aluminum. A second contact plate 10 that is likewise cuboidal and made of aluminum is provided for heat sink 6, which here functions by way of example as a waste-heat receiver. When coupling system 2 is in its final mounting condition, the two contact plates 8, 10 are positioned plane-parallel against each other, as shown in FIGS. 2 and 3, for the purpose of heat exchanging. The two contact plates 8, 10 are accordingly both components of converter 4 or, as the case may be, heat sink 6 and part of coupling system 2. A plurality of tongue and groove connections are provided for connecting and tensioning the two contact plates 8, 10 so that coupling system 2 in the exemplary embodiment is provided by the two contact plates 8, 10 and the tongue and groove connections.

The waste and lost heat produced by converter 4 is fed in a manner not presented in further detail into first contact plate 8 and forwarded by means of the thermal interface into second contact plate 10. The waste heat is then carried away from second contact plate 10, meaning that the waste or lost heat will be ducted away from the waste-heat generator in keeping with the specified aim. That takes place in the exemplary embodiment with the aid, by way of example, of an arrangement of cooling fins 12 molded onto second contact plate 10.

Figure 4:
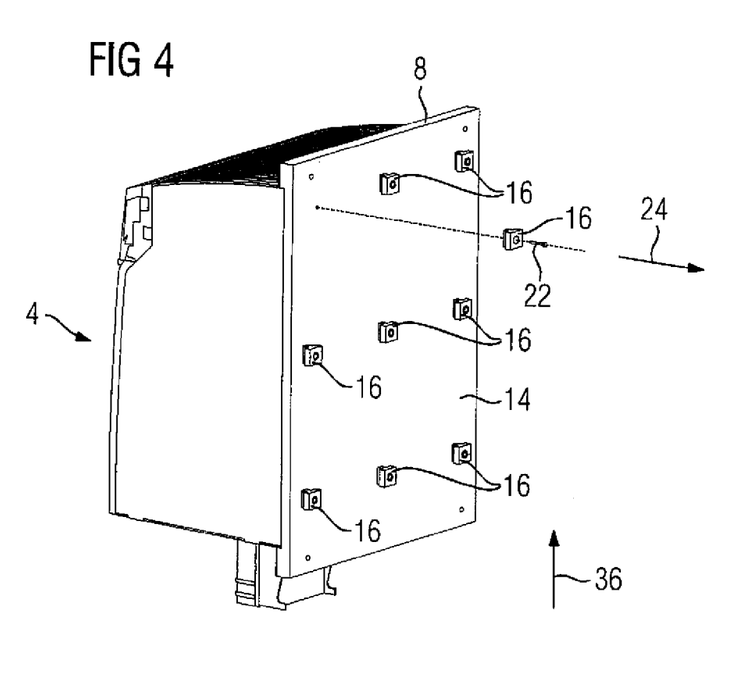
FIG. 4 is a perspective view of the converter having a number of mounted sliding blocks.

For embodying the tongue and groove connections a plurality of sliding blocks 16 are arranged on a first contact area 14 of first contact plate 8 and a plurality of grooves 20 are arranged on a second contact area 18 of second contact plate 10. Sliding blocks 16 therein model, as shown in FIG. 4, the corners of a regular grid having a rectangular elementary cell. The number selected here of 9 sliding blocks 16 serves as an expedient match for the application being described and in particular for the typical dimensions of a converter 4. Each sliding block 16 is fixed into position with the aid of a screw 22 that traverses sliding block 16 in the direction of the surface normal 24 of first contact area 14. The head of screw 22 is therein countersunk in sliding block 16 in the final mounting condition.

As can be seen from FIG. 1, the tongue and groove connection includes at least three grooves 20 which extend longitudinally in a vertical direction and are spaced from one another in a horizontal direction, and blocks 16 inserted in the grooves 20 and spaced from each other in a vertical direction in each groove 20. The two grooves 20 are located adjacent to the edges of the contact area 18, while third groove 20 is located centrally and equidistantly from the two grooves.

Figure 5:
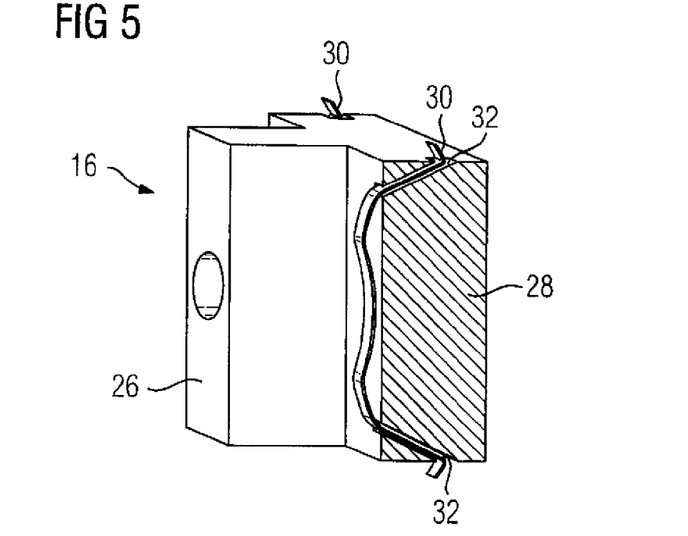
FIG. 5 is a perspective view of one of the sliding blocks.
Figure 6:
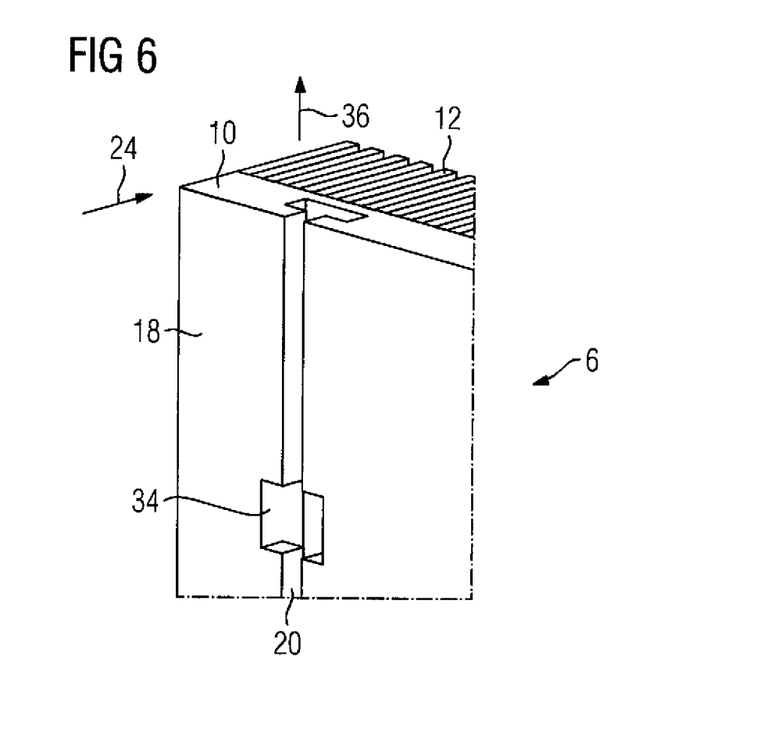
FIG. 6 is an enlarged detailed view of the area VI encircled in FIG. 1.
Figure 7:
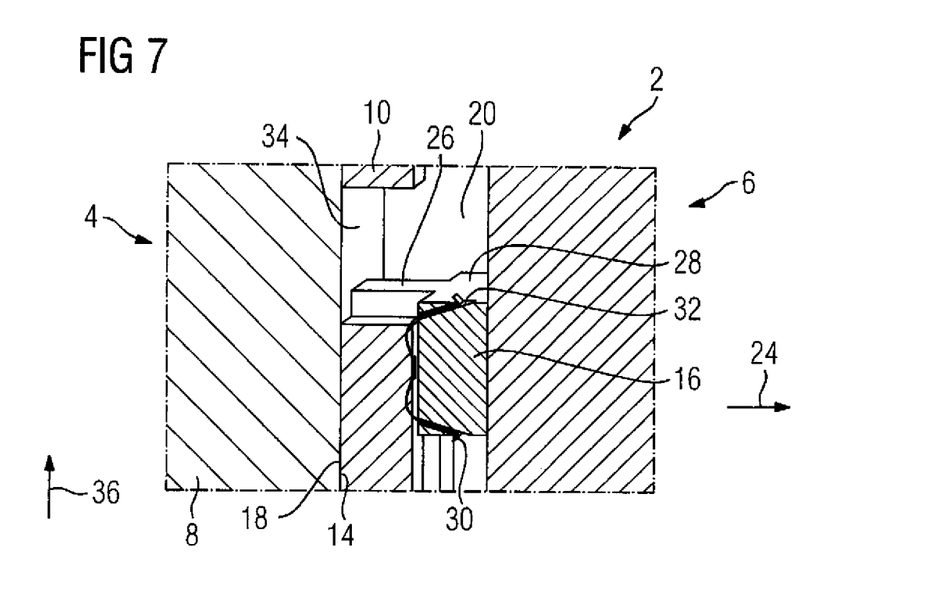
FIG. 7 is an enlarged sectional view of the converter and heat sink in their final mounting condition together with an overlapping representation of a leaf spring.
Figure 8:
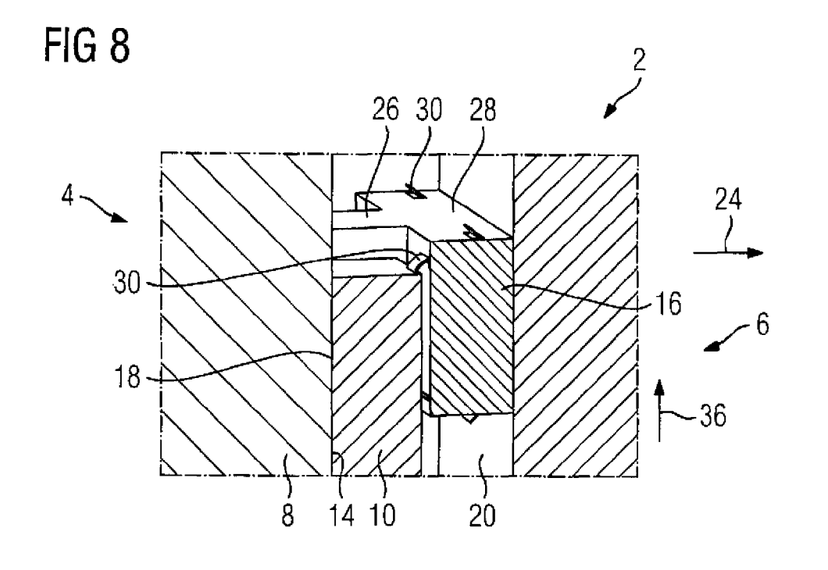
FIG. 8 is an enlarged detailed view of the area VIII encircled in FIG. 2.
Figure 9:
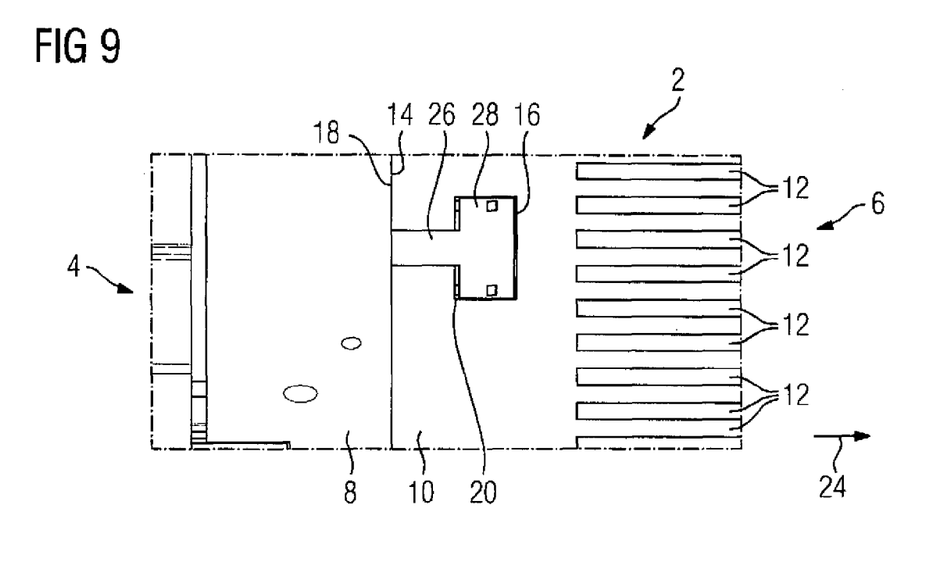
FIG. 9 is an enlarged detailed view IX of the area encircled in FIG. 10.
Figure 10:
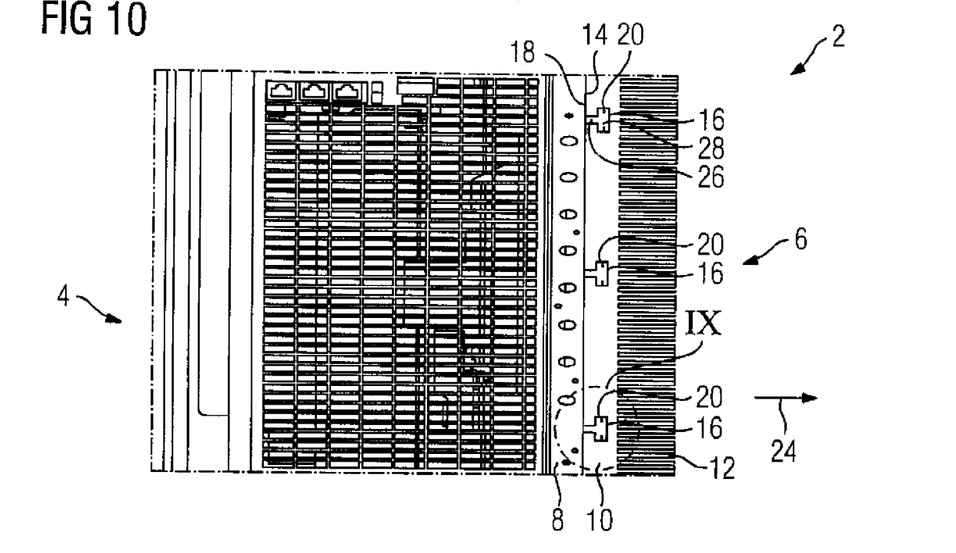
FIG. 10 is a top view of the converter and heat sink in their final mounting condition.

A straight prism having a T-shaped basal area serves, as can be seen from FIG. 5, as the basic form for sliding blocks 16. Located approximately halfway up the prism is a cylindrical channel that serves to accommodate screw 22, by which it is traversed in the final mounting condition. Each sliding block 16 is in an alternative treatment formed by two cuboidal and mutually perpendicularly arranged partial bodies, with one partial body functioning as a base 26 and being in its final mounting condition positioned against first contact area 14 and the other partial body being positioned as crossbar 28 in corresponding groove 20 for embodying the tongue and groove connection.

Secured on crossbar 28 on both sides of base 26 are two pre-tensioned leaf springs 30 whose restoring force in their final mounting condition is in the direction of the surface normal 24. Leaf springs 30 are therein identical in design and have as their basic shape the form of a W. For fixing into position, the two end sections of each leaf spring 30 are positioned in slot-shaped retaining grooves 32 which have been worked, approaching each other obliquely, into the flanks of crossbar 28 on the edge sides. The ends of each leaf spring 30 moreover project out of crossbar 28 and are bent outward like a barbed hook so that each acts as an engaging-behind element.

As a counterpart to sliding blocks 16, second contact plate 10 has three mutually parallel grooves 20 that have a T-shaped cross-section matched to the shape of sliding blocks 16. Three cuboidal insertion openings 34 are furthermore provided for each groove 20. The spacing between insertion openings 34 in the longitudinal direction 36 of grooves 20 and transversely to the longitudinal direction 36 and accordingly also the spacing between grooves 20 corresponds to the dimensions of the elementary cell that serves as the basis for positioning sliding blocks 16 relative to each other.

The two contact plates 8, 10 are within the scope of mounting consequently first brought closer together in the direction of the surface normal 24, with sliding blocks 16 being ducted through insertion openings 34 and then lowered into second contact plate 10. The two contact areas 14, 18 are now positioned against each other and sliding blocks 16 will then be inserted into grooves 20 by now moving the two contact plates 8, 10 against one another in the longitudinal direction 36 of grooves 20 so that tongue and groove connections will be embodied as a consequence. That situation is shown in FIGS. 6 to 10. Leaf springs 30 will be further tensioned when sliding blocks 16 are inserted into grooves 20, with the restoring force of each leaf spring 30 acting in the direction of the surface normal 24, as a result of which the two contact areas 14, 18 will ultimately be pressed one against the other.

Figure 11:
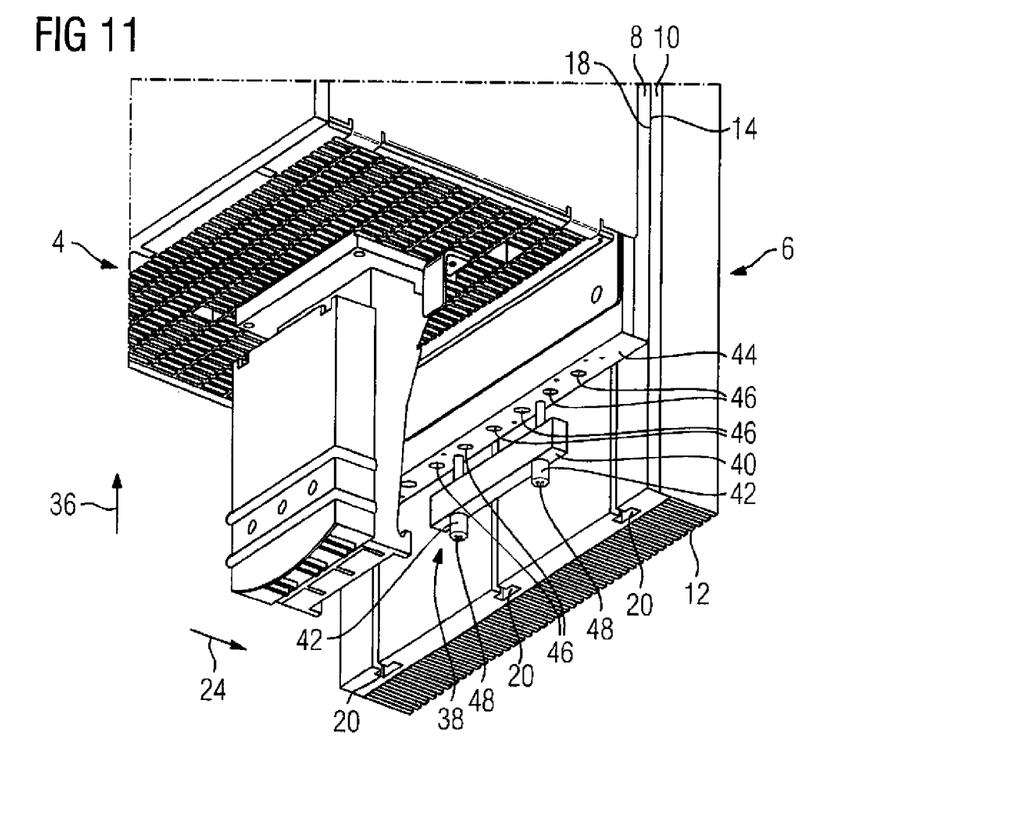
FIG. 11 is a perspective view of the converter and heat sink in their condition at an intermediate mounting step.

Since the efficiency of heat exchanging between the two contact plates 8, 10 increases with increasing clamping pressure between the two contact areas 14, 18, an as great as possible restoring force on the part of leaf springs 30 is basically desirable, which, though, will make it difficult to insert sliding blocks 16 into grooves 20. A mounting aid 38 is therefore provided for coupling system 2. An auxiliary bar 40 that is traversed by two mounting screws 42 in the longitudinal direction 36 is arranged therefor and fixed into position on second contact area 18. Mounting channels 46 having an internal thread have as a supplement thereto been worked in an end face 44 of first contact plate 8. Mounting screws 42 engage into mounting channels 46 during mounting so that turning mounting screws 42 will cause the two contact plates 8, 10 to be moved against each other in the longitudinal direction 36. For particularly easy handling a tool-engagement means 48 which in the exemplary embodiment is embodied as a hexagon socket is furthermore provided on each of the heads of mounting screws 42.

The invention is not restricted to the above-described exemplary embodiment. Rather it is the case that other variants of the invention can also be derived herefrom by a person skilled in the relevant art without departing from the subject matter of the invention. In particular it is furthermore possible for all the individual features described in connection with the exemplary embodiment to be combined with each other in another manner without departing from the subject matter of the invention.

While the invention has been illustrated and described in connection with currently preferred embodiments shown and described in detail, it is not intended to be limited to the details shown since various modifications and structural changes may be made without departing in any way from the spirit and scope of the present invention. The embodiments were chosen and described in order to explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

What is claimed is:

1. A coupling system as a thermal interface between a waste-heat generator and a waste-heat receiver, said coupling system comprising;
   a first body having a first contact area;
   a second body having a second contact area, said first and second contact areas abutting one another for heat exchange; and
   a tongue and groove connection provided in two edge regions of the first and second contact areas and in a central region of the first and second contact areas which is substantially central and equidistant from the edge regions, the tongue and groove connection having a plurality of grooves extending vertically in a longitudinal direction and spaced horizontally from each other and a plurality of tongues formed as sliding blocks inserted in each of the grooves and spaced vertically from each other and connecting and tensioning the first and second contact areas, wherein the plurality of grooves of the tongue and groove connection includes three grooves, with two of the grooves arranged adjacent to two vertical edges of the first contact area correspondingly and a third of the grooves arranged horizontally between the two grooves and substantially centrally and equidistantly from the two grooves, wherein the sliding blocks are fixed in the first contact area, and a spring element is positioned on an element of the tongue and groove connection and provides in mounting condition a restoring force acting substantially in a direction of surface normal of the first and second contact areas so that due to the restoring force a contact pressure which forces the first and second contact areas to one another is increased, wherein the element of the tongue and groove connection on which the spring element is positioned is the sliding block of the tongue and groove connection, wherein each of the sliding blocks is T-shaped and has a base and a crossbar extending perpendicular to the base, and the spring elements are secured on the crossbar on both sides of each of the sliding blocks.

2. The coupling system of claim 1, wherein the waste-heat generator is a converter.

3. The coupling system of claim 1, wherein the waste-heat receiver is a heat sink.

4. The coupling system of claim 1, wherein the grooves and the tongues are configured to exert a clamping force in a direction of the surface normal of the first and second contact areas, when the grooves and the tongues are fitted together.

5. The coupling system of claim 1, wherein the sliding blocks are arranged substantially evenly distributed on the first contact area.

6. The coupling system of claim 5, wherein the sliding blocks are arranged in the form of a matrix.

7. The coupling system of claim 1, wherein the grooves are arranged in substantially parallel arrangement on the second contact area.

8. The coupling system of claim 1, wherein each of the grooves has at least one insertion opening for receiving the tongue.

9. The coupling system of claim 1, wherein the spring element is located on an underside of the crossbar.

10. The coupling system of claim 1, wherein the spring element is a leaf spring.

11. The coupling system of claim 10, wherein the leaf spring is shaped like a W.

12. The coupling system of claim 1, wherein the spring element is fixed on the element of the tongue and groove connection by a form-fit connection.

13. The coupling system of claim 1, further comprising a mounting aid configured to exert a mounting force in a longitudinal direction for realizing the tongue and groove connection.

14. The coupling system of claim 13, wherein the mounting aid has a threaded bolt and a counter thread for receiving the threaded bolt such that twisting the threaded bolt in the counter thread causes the first and second contact areas to move against each other transversely normal to the contact areas.

15. The coupling system of claim 1, wherein the crossbar of each of the sliding blocks has a slot-shaped retaining groove in which two end section of each of the spring elements are positioned.

* * * * *